US012683203B2

(12) United States Patent
Müller et al.

(10) Patent No.: US 12,683,203 B2
(45) Date of Patent: Jul. 14, 2026

(54) TEST DEVICE AND METHOD FOR TESTING SEGMENTS FOR THE ENERGY CELL-PRODUCING INDUSTRY

(71) Applicant: KÖRBER TECHNOLOGIES GMBH, Hamburg (DE)

(72) Inventors: Johannes Müller, Hamburg (DE); Christian Frédéric Adolff, Hamburg (DE); Ronald Hroch, Trittau (DE); Christian Steinhöfel, Adendorf (DE)

(73) Assignee: KÖRBER TECHNOLOGIES GMBH, Hamburg (DE)

( * ) Notice: Subject to any disclaimer, the term of this patent is extended or adjusted under 35 U.S.C. 154(b) by 178 days.

(21) Appl. No.: 18/834,502

(22) PCT Filed: Feb. 13, 2023

(86) PCT No.: PCT/EP2023/053487
§ 371 (c)(1),
(2) Date: Jul. 30, 2024

(87) PCT Pub. No.: WO2023/161061
PCT Pub. Date: Aug. 31, 2023

(65) Prior Publication Data
US 2025/0132407 A1      Apr. 24, 2025

(30) Foreign Application Priority Data
Feb. 24, 2022      (DE) .......................... 102022104476.9

(51) Int. Cl.
*H01M 10/42*          (2006.01)
*G01R 31/385*        (2019.01)
(52) U.S. Cl.
CPC .... *H01M 10/4285* (2013.01); *G01R 31/3865* (2019.01)

(58) Field of Classification Search
None
See application file for complete search history.

(56) References Cited

U.S. PATENT DOCUMENTS

| | | | |
|---|---|---|---|
| 2019/0064277 A1* | 2/2019 | Cai ..................... | H01M 10/482 |
| 2019/0237822 A1 | 8/2019 | Rober et al. | |
| 2023/0142533 A1* | 5/2023 | Taniguchi .............. | G01R 31/16 |
| | | | 324/551 |

FOREIGN PATENT DOCUMENTS

| | | |
|---|---|---|
| CN | 209624641 A | 11/2019 |
| CN | 110095517 B | 7/2021 |

(Continued)

OTHER PUBLICATIONS

Examination Report issued by the German Patent Office dated Dec. 12, 2022 in parallel German Patent Application No. 10 2022 104 476.9 with an English translation.

*Primary Examiner* — Jas A Sanghera
(74) *Attorney, Agent, or Firm* — SALIWANCHIK, LLOYD & EISENSCHENK

(57) ABSTRACT

Testing device for testing segments that are suitable for forming a cell stack for the energy cell producing industry, wherein:

a conveying apparatus with a plurality of receiving portions is provided for receiving and transporting a segment in each case, wherein the receiving portions are movable relative to a stationary part of the testing device by a movement of the conveying apparatus, characterized in that the receiving portions each comprise at least two contact surfaces for contacting, electrically and/or by signal, a segment received in the respective receiving portion, wherein (Continued)

at least two of the contact surfaces of one of the receiving portions can be connected to at least one measuring device by means of a switching matrix.

15 Claims, 6 Drawing Sheets

(56)                    References Cited

FOREIGN PATENT DOCUMENTS

| | | | |
|---|---|---|---|
| DE | 10 2017 216 138 | A1 | 3/2019 |
| DE | 10 2017 216 213 | A1 | 3/2019 |
| JP | S63-299062 | A | 12/1988 |
| JP | 2011-232262 | A | 11/2011 |
| JP | 2021-144874 | A | 9/2021 |
| WO | WO 2016/041713 | A1 | 3/2016 |
| WO | WO 2020/106031 | A1 | 5/2020 |

* cited by examiner

TEST DEVICE AND METHOD FOR TESTING SEGMENTS FOR THE ENERGY CELL-PRODUCING INDUSTRY

CROSS REFERENCE TO RELATED APPLICATIONS

This application is a National Stage Application of International Application Number PCT/EP2023/053487, filed Feb. 13, 2023; which claims priority to German Patent Application No. 10 2022 104 476.9, filed Feb. 24, 2022.

FIELD OF THE INVENTION

The present invention relates to a measurement system for measuring energy cells and to a measurement method.

BACKGROUND OF THE INVENTION

Energy cells or energy storage cells such as battery cells are used for galvanic accumulators, for example in motor vehicles, other land vehicles, ships and airplanes, where a considerable amount of energy must be retrievably stored for long periods of time. For this purpose, such energy cells have a structure consisting of a plurality of segments stacked to form a stack, hereinafter referred to as a cell stack. These segments are formed by monocells, for example. Monocells are alternating anode sheets and cathode sheets, also known as electrodes, which are separated from each other by separator sheets. A monocell therefore typically has the following layer sequence: separator-electrode (e.g. anode)—separator—electrode (e.g. cathode).

The segments are pre-cut in the production process and then placed on top of each other in the predetermined sequence to form the cell stacks and joined together, for example by lamination.

Devices for producing battery cells are known, for example, from WO 2016/041713 A1 and DE 10 2017 216 213 A1.

The segments may be damaged during the production process. In the case of segments in the form of monocells, for example, the separator may be damaged during production. If a monocell with a damaged separator is used to form the cell stack, this can negatively affect the functionality and service life of the cell stack.

Energy cells can also be fuel cells or solar cells, for example, where segments can also be damaged during production.

It is therefore known in principle from the prior art to test segments before the stacking process and, if necessary, to eject them from the production process so that only flawless segments are used to form a cell stack.

Such test procedures must take into account the production output and conveying speed of current production systems. It is therefore known in principle from the prior art to provide testing devices that move along with the segments in the production process and alternately test the segments. For this purpose, the testing device actively contacts what are known as conductor lugs, which are part of the electrodes of the segments. However, the performance of the machine is limited in such test procedures due to the discontinuous movements. Furthermore, the segments can be damaged when contacting the conductor lugs.

BRIEF SUMMARY OF THE INVENTION

The object of the present application is to provide an improved testing device for testing segments, and a corresponding method.

The object is achieved by the features of the independent claims. Further preferred embodiments of the invention can be found in the dependent claims, the figures, and the associated description.

DETAILED DESCRIPTION

Accordingly, to achieve the object, a testing device for testing segments that are suitable for forming a cell stack for the energy cell producing industry is proposed, wherein a conveying apparatus having a plurality of receiving portions for receiving and transporting in each case one segment is provided, wherein the receiving portions are movable relative to a stationary part of the testing device by a movement of the conveying apparatus, wherein the receiving portions each comprise at least two contact surfaces for contacting, electrically and/or by signal, a segment received in the corresponding receiving portion, wherein at least two of the contact surfaces of one of the receiving portions can be connected to at least one measuring device by means of a switching matrix.

The segments positioned in the receiving portions can be transported by means of the conveying apparatus, wherein the segments can be tested during the transportation process by means of the contact surfaces. If the receiving portion comprises at least two contact surfaces, at least one separator can be measured.

Preferably, the receiving portions each comprise at least three contact surfaces, more preferably exactly three contact surfaces.

Preferably, the switching matrix is configured to connect the at least two or three contact surfaces of one of the receiving portions differently so that measurements can be carried out by means of the at least one measuring device in a predetermined electrical circuit or in different electrical circuits.

The switching matrix within the meaning of this application preferably comprises at least one input channel and a plurality of output channels that can be interconnected with each other in predefined configurations. Furthermore, the switching matrix can be configured to interconnect two or more output channels.

By connecting the at least two contact surfaces of the receiving portions to the output channels of the switching matrix, these can be connected to the at least one measuring device that is connected to the at least one output channel. In principle, it is also possible to connect the at least one measuring device to the switching matrix via two or more input channels.

Preferably, all contact surfaces of the receiving portions are connected to the switching matrix on the output channel side. Also preferably, all measuring devices are also connected to the switching matrix on the input channel side.

It goes without saying that the matrix can in principle comprise other input channels and/or other output channels that are not connected to the at least one measuring device or the contact surfaces. For example, additional input channels can be provided via which a voltage source is connected to the switching matrix.

At least two of the at least three contact surfaces of a receiving portion can preferably be connected to the measuring device at the same time. For example, conclusions can be drawn about the system status of the corresponding segment based on the measurement of an impedance, an ohmic resistance or the electrical capacitance between two of the at least three contact surfaces. The ohmic resistance can be measured with direct current or as the reciprocal value of the real part of the complex admittance with an alternating voltage, for example at a frequency of 1 kHz, 10 kHz or 1000 kHz. The capacitance can also be measured with alternating voltage. For example, a breakdown measurement can be used to detect foreign bodies whose diameter or extent is less than the layer thickness of the separator. If, for example, the segment to be tested is formed by a monocell as described above, the electrical resistance between two electrodes can be reduced if the separator between these electrodes is damaged.

The at least three, preferably exactly three, contact surfaces per receiving portion mean that what is known as a 3-port measurement of the segment arranged in the receiving portion can be carried out. This has the advantage that the two separators of a monocell can be tested separately and/or together. Thus, not only the separator of the segment arranged between the first and second electrode can be tested, but also the external separator, which is only contacted by an electrode of a neighboring segment when the cell stack is formed. The corresponding measurements can be carried out by intelligently connecting the contact surfaces to the at least one measuring device.

Furthermore, the advantage of having at least three contact surfaces per receiving portion is that extremely gentle electrical contacting of the segment is made possible. By accordingly connecting two of the three contact surfaces, different measurements can be carried out without having to remove the segment from the receiving portion. By avoiding the transfer of the segment to be tested to an additional receiving portion or to an additional testing device, the segment can be measured in a way that is particularly gentle on the product. In particular, the extremely sensitive conductor lugs of the electrodes, which have already been mentioned above, do not have to be contacted multiple times.

Preferably, the conveying apparatus is formed by a rotatably mounted drum on the radially lateral surface of which the receiving portions are arranged. This means that the segments to be tested can be conveyed by a rotational movement, which is particularly simple and efficient. The conveying apparatus is then formed by a test drum. The receiving portions are firmly connected to the drum, i.e. can only be detached with the aid of tools, or the receiving portions themselves form the drum.

Preferably, a plurality of measuring devices are provided, wherein the switching matrix is configured to connect, electrically and/or by signal, one or more of the contact surfaces of one of the receiving portions to different measuring devices. This means that the segments can be connected to different measuring devices without being removed from the respective receiving portion, which allows different parameters to be measured in a way that is particularly gentle on the product. It is also possible, for example, for segments that are stored in different receiving portions to be tested in parallel.

According to a preferred embodiment, it is proposed that the receiving portions each comprise a first and a second contact surface for contacting, electrically and/or by signal, two electrodes of an inserted segment, and wherein a third contact surface is provided in each case for contacting, electrically and/or by signal, one of the separators of the inserted segment. Preferably, each of the receiving portions has contact surfaces arranged in this way. This arrangement of the contact surfaces within a receiving portion allows the separators of a monocell to be tested separately from each other in an advantageous manner without having to remove the monocell from the receiving portion of the conveying apparatus. The third contact surface therefore serves as a temporary electrode assigned to the testing device, by means of which an external separator of the segment can be tested.

Preferably, the third contact surface simultaneously forms a transport support for the respective segment or at least part of the transport support. The flat extension of the third contact surface corresponds to the surface of the electrodes of the respective segment without their conductor lugs; preferably, the flat extension of the third contact surface deviates by less than 50% from the flat extension of the electrodes, more preferably less than 25%, in particular less than 10%. This means that the transport support simultaneously performs both the function of transporting a segment and the function of connecting a separator of the transported segment electrically or by signal. If, for example, a segment in the form of a monocell is transported in the receiving portion, the segment to be tested preferably rests by one of its separators on the transport support of the respective receiving portion. The two electrodes of the segment are then contacted by the first and second contact surfaces by means of the aforementioned conductor lugs that protrude beyond the base of the separators.

According to an additional preferred embodiment, a pure transport support can also be provided instead of the third contact surface. In this embodiment, the pure transport support preferably consists of an insulating material, for example to reduce scattering capacities during measurement by means of the first and second contact surfaces.

The disclosure of this application also explicitly includes the proposed device together with one segment or a plurality of segments, for example in the form of monocells, which is or are mounted in the receiving portions.

Preferably, the switching matrix is configured to connect the first and second contact surfaces to the same measuring device at the same time, to connect the first and third contact surfaces to the same measuring device at the same time, and/or to connect the second and third contact surfaces to the same measuring device at the same time. If, for example, a segment in the form of a monocell is mounted in one of the receiving portions for the purpose of testing, the three contact surfaces of a receiving portion then contact the inserted segment as follows:

The segment rests with a first separator on the third contact surface; a first electrode adjacent to the first separator, for example in the form of an anode, rests on the first contact surface; a second electrode separated from the first electrode by a second separator, for example in the form of a cathode, is connected to the second contact surface.

If the first and second contact surfaces are connected to the at least one measuring device at the same time, then the second separator arranged therebetween can be tested.

If the first and third contact surfaces are connected to the least one measuring device at the same time, then the separator arranged on the outside of the segment can be tested.

If the second and third contact surfaces are connected to a measuring device at the same time, then the first and second separators can be tested at the same time. Depending on the switching configuration, the first and second separators are then arranged in a series or parallel connection between the second and third contact surfaces.

These switching configurations, which can be adjusted using the switching matrix, allow comprehensive testing of the segments to be tested.

According to an additional preferred embodiment, it is proposed that the contact surfaces are arranged electrically insulated from each other within one of the receiving portions. Preferably, the contact surfaces are also electrically insulated from the remaining part of the conveying apparatus. For example, the contact surfaces can also be electrically insulated from each other in that the conveying apparatus is at least partially made of an electrically non-conductive material.

Preferably, the switching matrix is configured to connect the at least three contact surfaces of one of the receiving portions differently so that measurements can be carried out in different electrical circuits by means of the at least one measuring device. Depending on whether, for example, the first or second separator or both separators are to be tested, the switching configuration can be different. In this way, a large number of measurements can be carried out on the segment while it is being transported on the conveying apparatus. For example, two or more contact surfaces of a receiving portion can also be short-circuited together.

Preferably, the switching matrix is configured to connect one or more of the contact surfaces of one of the receiving portions to a voltage source and/or to ground. These types of connections can allow for additional switching configurations, so that the measurement options can be expanded.

Preferably, the switching matrix comprises a plurality of relays for connecting the contact surfaces to each other and/or one or more of the contact surfaces to one or more measuring devices. The relays can be controlled or regulated by means of a control unit, for example. Due to the large number of switching combinations, it has proven to be advantageous to operate the switching matrix with relays. The switching matrix and therefore also the relays can, for example, be based on the position of the conveying apparatus relative to the stationary part of the testing device. Of course, other input parameters can be used alternatively or additionally to control or regulate the switching matrix or the relays. The relays are also preferably used to connect one or more contact surfaces to ground and/or to connect them to a voltage source. The main advantage of the relays is passive, galvanically isolated switching and the minimally invasive behavior with regard to changes in the measuring distance. Furthermore, relays are able to conduct direct current and alternating current; switching transistors are only able to do this to a limited extent. Furthermore, switching transistors have a considerable influence on the measuring distance.

Preferably, the switching matrix is part of the conveying apparatus. In this way, the connection to the conveying apparatus can be carried out efficiently.

Preferably, the at least one measuring device is configured to measure an electrical capacitance, and/or an ohmic resistance, and/or to carry out a breakdown measurement. Measuring devices and measuring methods for measuring ohmic resistance and electrical capacitance are well known and provide reliable measurement results. By testing the segments by measuring the ohmic resistance and/or the electrical capacitance, reliable conclusions can be drawn about the system status of the segments to be tested.

Preferably, the at least one measuring device is a component of the stationary part of the testing device. Accordingly, the at least one measuring device does not have to be moved with the conveying apparatus. This is particularly advantageous if the testing device comprises a plurality of measuring devices. Furthermore, the measuring devices can also be advantageously connected to the contact surfaces of different receiving portions so that a smaller number of measuring devices is required. In principle, however, it is also possible to integrate one or more of the measuring devices into the conveying apparatus.

According to an additional preferred embodiment, it is proposed that the electrical and/or signal connection of the conveying apparatus to the stationary part is made by means of a sliding contact apparatus. A sliding contact apparatus has proven to be advantageous for connecting the moving, for example rotating, conveying apparatus to the stationary part of the testing device electrically and/or by signal.

Preferably, the receiving portions each have openings to which a vacuum can be applied to hold the segments. The segments, in particular the conductor lugs, can be held particularly gently using a vacuum since there is no need for grippers and/or clamps that can damage the conductor lugs. The openings can be provided in the transport support, for example in the form of the third contact surface, and/or in at least one of the other contact surfaces. Furthermore, the openings can be formed, for example, by retaining holes or by the pores of an air-permeable material. Alternatively, however, it is also possible for the segments to be held in the receiving portions by mechanical means.

The object mentioned at the beginning is also achieved by a method for testing segments that are intended to form a cell stack for the energy cell producing industry, wherein the segments are tested by the testing device as described above, wherein the segments to be tested are each positioned in one of the receiving portions.

Preferably, the segments are tested during transportation of the segments, i.e. while the conveying apparatus is moving relative to the stationary part of the testing device.

Also preferably, the detection of a damaged or poor-quality segment leads to it being ejected from the production process. This can be done, for example, by the testing device itself, or alternatively by a separate apparatus, for example in the form of an ejection drum.

Alternatively or additionally, it is also possible to record the quality parameters of the segments for later use by means of the testing device without necessarily ejecting them from the process. In this way, for example, the stack of formed cells can be classified into different quality classes.

With regard to the technical effects and advantages associated with the proposed method, reference is made to the previous explanations in connection with the testing device.

BRIEF DESCRIPTION OF THE FIGURES

The invention is explained below using preferred embodiments with reference to accompanying figures.

In the drawings:

FIG. 1 shows a system 100 for forming cell stacks comprising a producing device 17 for forming segments 2, a testing device 1 for testing the segments 2 and a plurality of cell stacking devices 18.

Figure 1:
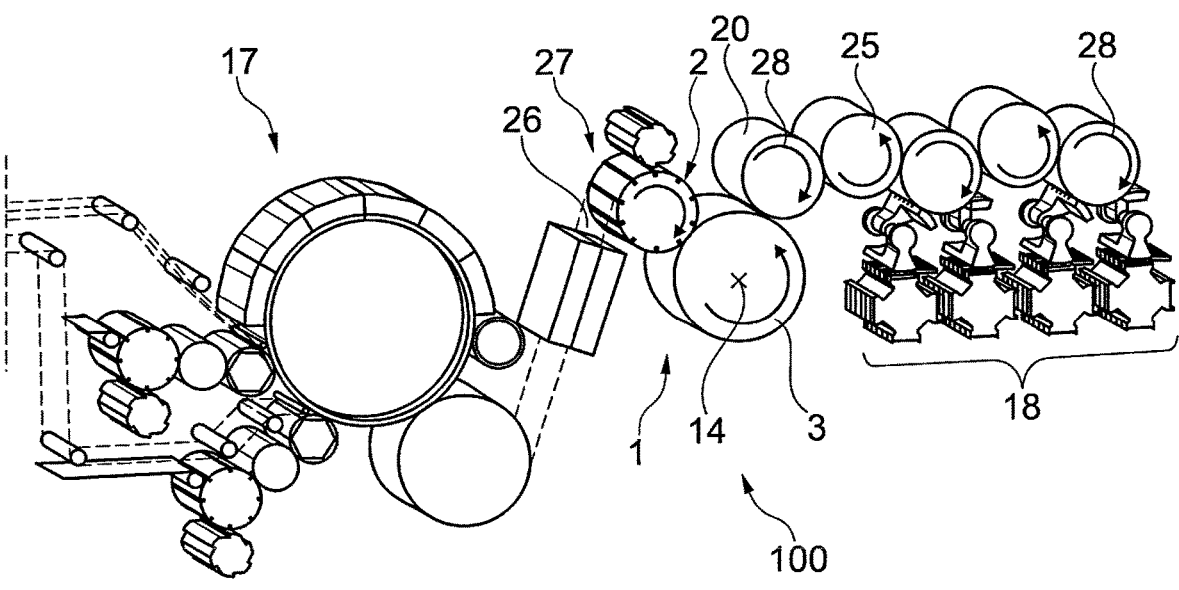
FIG. 1 shows the arrangement of the testing device in a system for forming cell stacks.

The producing device 17 of this exemplary embodiment is configured to produce segments 2 in the form of mono-cells. The monocells are four-layered, wherein the following four layers follow one another: a separator 21, a first electrode 22 in the form of an anode, a second separator 23, and a second electrode 24 in the form of a cathode. In the producing device 17, these layers are placed on top of each other and joined together by lamination so that a four-layer continuous sheet 26 is formed.

This continuous sheet 26 is cut by means of a cutting apparatus 27 into portions of equal length orthogonal to the longitudinal direction so that segments 2 of equal length are formed. The segments 2 fed to the testing device 1 are so-called dry segments 2, i.e. they are not filled with an electrolyte liquid. The cut segments 2 are tested by means of the testing device 1 following the producing device 17 in the production process.

A plurality of cell stacking devices 18 follow the testing device 1 in the production process, each of which is configured to place the segments 2 on top of each other to form cell stacks. In this case, four cell stacking devices 18 are provided with which the cell stacks can be formed in parallel.

The testing device 1 is used to detect defective or damaged segments 2 so that they are not used to form the cell stacks with the cell stacking devices 18. For the sake of simplicity, the term "defective segments 2" is used below, wherein this means all segments 2 that do not meet the specified quality requirements. In this exemplary embodiment, the testing device 1 itself is not configured to eject defective segments 2 from the production process. In this exemplary embodiment, this is done by an ejection drum 25 that ejects the defective segments into a reject reservoir (not shown). In this case, the testing device 1 comprises a conveying apparatus 3 in the form of a testing drum mounted to rotate about an axis of rotation 14. A transport drum 20 is provided between the conveying apparatus 3 and the ejection apparatus 25. The direction of rotation of the drums is indicated by arrows 28, only two of which are provided with the corresponding reference sign. By ejecting faulty segments 2 by means of the ejection drum 25, it can be ensured that only faultless segments 2 are used to form the cell stacks with the cell stacking devices 18.

Figure 2:
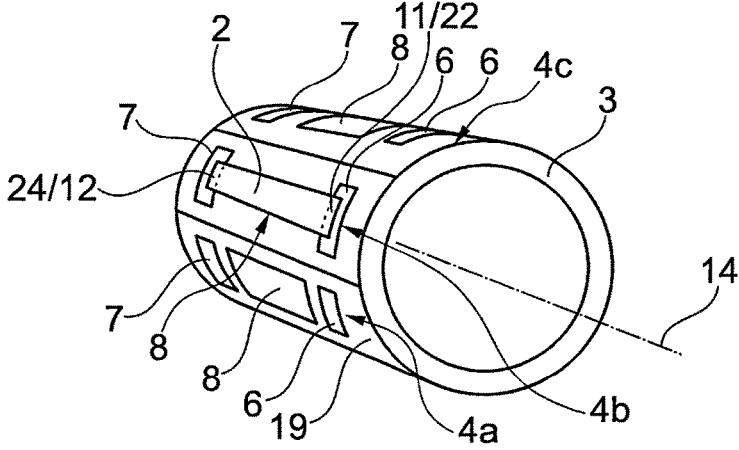
FIG. 2 shows a conveying apparatus in the form of a test drum.

FIG. 2 shows the conveying apparatus 3 in the form of a test drum that is mounted so that it can rotate about the axis of rotation 14. The conveying apparatus 3 has a plurality, for example between 3 and 19, further for example between 10 and 16, of receiving portions 4a, 4b, 4c on a radially outer lateral surface 19, each of which is configured to receive and transport a segment 2. The conveying apparatus 3 shown here comprises exactly twelve of the receiving portions 4. The conveying apparatus 3 rotates relative to a stationary part 5 of the testing device 1 shown schematically in FIG. 4. The receiving portions 4a, 4b, 4c visible here can be subjected to a vacuum so that the segments 2 are held on the receiving portions 4a, 4b, 4c by the effect of the vacuum. This also allows the segments 2 to be received and handed over in a way that is gentle on the product.

Each of the receiving portions 4a, 4b, 4c has a first contact surface 6, a second contact surface 7 and a third contact surface 8, wherein these are electrically insulated from each other and from the remaining part of the conveying apparatus 3. The receiving portion 4b is covered with a segment 2 so that the third contact surface 8 of the receiving portion 4b is covered by the segment 2. However, it can be seen that a first electrode 22 contacts the first contact surface 6 by means of its conductor lug 11. It can also be seen that a second electrode 24 contacts the second contact surface 7 by means of its conductor lug 12. The contacting of the segment 2 with the third contact surface 8 of the receiving portion 4b is described below with reference to FIG. 3.

Figure 3:
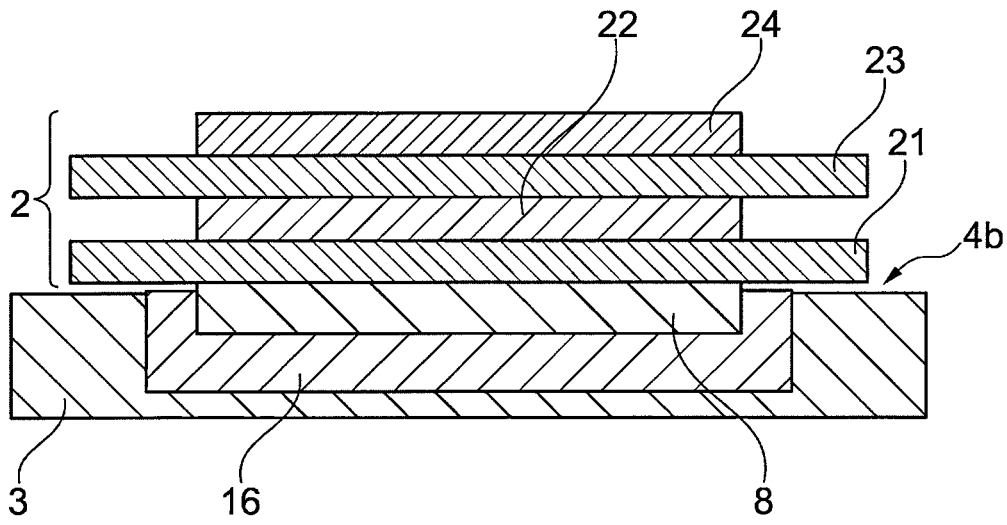
FIG. 3 shows a receiving portion with a segment arranged thereon in a first cross section orthogonal to the axis of rotation.

FIG. 3 is a sectional view of a segment 2 arranged on the conveying apparatus 3, wherein the section is arranged in a plane orthogonal to the axis of rotation 14 (see FIG. 2) of the conveying apparatus 3. The sectional view in FIG. 3 shows the receiving portion 4b from FIG. 2. The receiving portion 4b comprises the third contact surface 8, which is electrically insulated from the rest of the receiving portion 4b and therefore also from the rest of the conveying apparatus 3 by means of an insulator 16. The segment 2 rests with the first separator 21 on the third contact surface 8, which simultaneously forms a suitable transport support for the segment 2. It can also be seen that the flat extension of the third contact surface 8 coincides with the main surface of the first and second electrodes 22 and 24 without taking into account the conductor lugs 11, 12 (not shown here).

In this way, the third contact surface 8 together with the first electrode 22 arranged above the first separator 21 can form a pair of electrodes that is suitable for testing the first separator 21 arranged therebetween. The first electrode 22 is then contacted via the first contact surface 6 as shown in FIG. 2.

FIG. 3 also shows that the first electrode 22 is followed by the second separator 23 and the second electrode 24. The first electrode 22 and the second electrode 24 therefore form an electrode pair that is suitable for testing the second separator 23 arranged therebetween.

Figure 4:
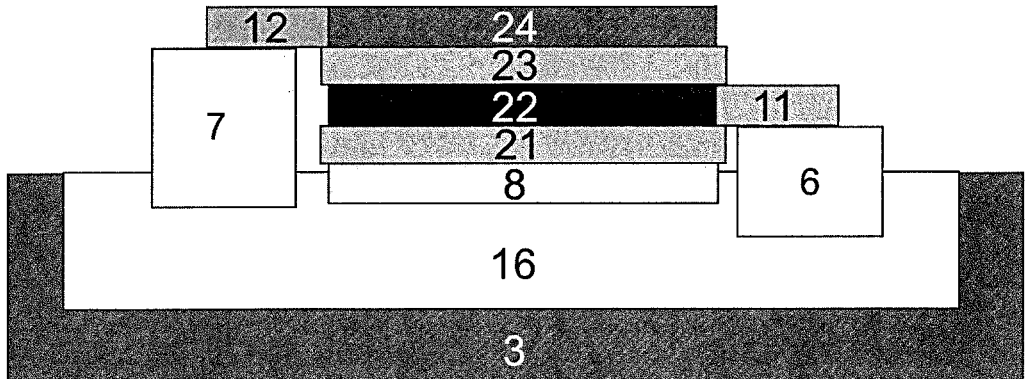
FIG. 4 shows a receiving portion with a segment arranged thereon in a second cross section parallel to the axis of rotation.

FIG. 4 is an additional sectional view of the segment 2 arranged on the conveying apparatus 3, wherein the section is arranged in a plane parallel to the axis of rotation 14 (see FIG. 2) of the conveying apparatus 3. In this illustration, it can be seen that the first electrode 22 contacts the first contact surface 6 by means of its conductor lug 11. It can also be seen that the second electrode 24 makes contact with the second contact surface 7 by means of its conductor lug 12. In order to prevent the conductor lugs 11, 12 from kinking, the contact surfaces 6, 7 have a correspondingly adapted height in the radial direction; the height in the radial direction of contact surface 6 is therefore less than the height of contact surface 7.

Figure 5:
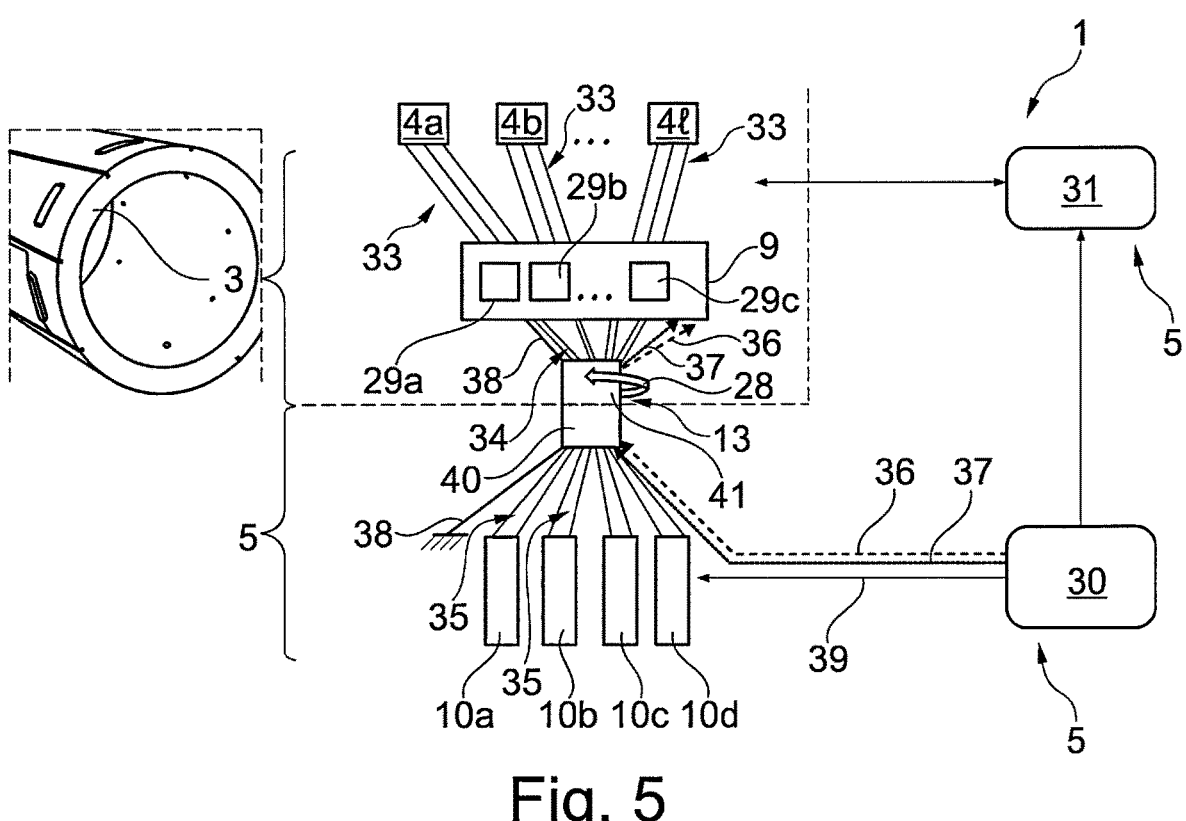
FIG. 5 is a schematic representation of the testing device.

FIG. 5 is a schematic representation of the testing device 1 comprising the conveying apparatus 3, which is rotatably mounted relative to the stationary part 5. The arrow 28 shows the rotational movement of the conveying apparatus 3 in the form of a test drum, which rotational movement can be effected by an actuator 31. The actuator 31 is controlled or regulated by a control unit 30. Both the control unit 30 and the actuator 31 are assigned to the stationary part 5. Furthermore, the twelve receiving portions 4a, 4b, . . . , 4l are shown schematically, each of whose three contact surfaces 6, 7, 8 are connected electrically and/or by signal to a switching matrix 9 via three lines 33. Thus, each of the receiving portions 4a, 4b, . . . , 4l is connected to the switching matrix 9 via three lines 33.

The switching matrix 9 comprises a plurality of relays 29a, 29b, 29c that are configured to connect the lines 33 to input lines 34. FIG. 5 shows only the three relays 29a, 29b and 29c, which are representative of a large number of relays. By means of a sliding contact apparatus 13, the input lines 34 rotating with the conveying apparatus 3 are transferred electrically and/or by signal to the stationary part 5.

The stationary part 5 comprises four measuring devices 10a, 10b, 10c, 10d, each of which is connected electrically and/or by signal to the sliding contact apparatus 13 with a line pair 35. In this way, each of the measuring devices 10a, 10b, 10c, 10d can be connected to the contact surfaces 6, 7, 8 (see FIG. 2) of the various receiving portions 4a, 4b, . . . , 4l in different constellations via the sliding contact apparatus 13 and the switching matrix 9.

For a better understanding, only the connection of the three lines 33, which are each assigned to one of the receiving portions 4a, 4b, . . . , 4l, with line pairs 35, which are each assigned to one of the measuring devices 10a, 10b, 10c, 10d, will be considered first. In order to connect the measuring devices 10a, 10b, 10c, 10d in all combinations to the three contact surfaces 6, 7, 8 of the receiving portions 4a, 4b, . . . , 4l, the switching matrix 9 must have 12×3=36 connections on the side assigned to the receiving portions 4a, 4b, . . . , 4l, because each of the twelve receiving portions 4a, 4b, . . . , 4l comprises three contact surfaces that are connected via the lines 33. Furthermore, the switching matrix 9 must have 4×2=8 connections on the side assigned to the sliding contact apparatus 13 because each of the four measuring devices 10a, 10b, 10c, 10d is equipped with a line pair 35.

In this consideration, a power supply 36 has not yet been taken into account that emanates from the control unit 30, which in turn comprises a voltage source. The power supply 36 is looped through to the switching matrix 9 by means of sliding contact apparatus 13. In this way, voltage can be applied to certain contact surfaces 6, 7, 8 in order to carry out measurements.

Furthermore, a data transmission line 37, which also originates from the control unit 30, has not yet been taken into account in the previous consideration. The data transmission line 37 is connected to the switching matrix 9 via the sliding contact apparatus 13 so that the relays 29a, 29b, 29c can be activated by means of the control signals thus transmitted from the control unit 30 to the switching matrix 9. The relays 29a, 29b, 29c are configured to connect the connections of the switching matrix 9 on the side of the receiving portions 4a, 4b, . . . , 4d with each other and/or with the connections of the switching matrix 9 on the side of the sliding contact apparatus 13.

Furthermore, an additional line 38, which is used for grounding or for switching one or more contact surfaces 6, 7, 8 to ground, was not taken into account in the previous consideration. This line 38 is also connected to the switching matrix 9 via the sliding contact apparatus 13.

Furthermore, the measuring devices 10a, 10b, 10c, 10d are also connected to the control unit 30 by means of a line 39. The measuring devices 10a, 10b, 10c, 10d, for example, can be controlled using this line. Furthermore, the values determined by the measuring devices 10a, 10b, 10c, 10d can also be stored in a data memory of the control unit 30. If, for example, a faulty segment 2 is detected by one of the measuring devices 10a, 10b, 10c, 10d, the control unit 30 can output a corresponding signal to the ejection drum 25 shown in FIG. 1 so that the corresponding segment 2 can be ejected from the production process.

Figure 6:
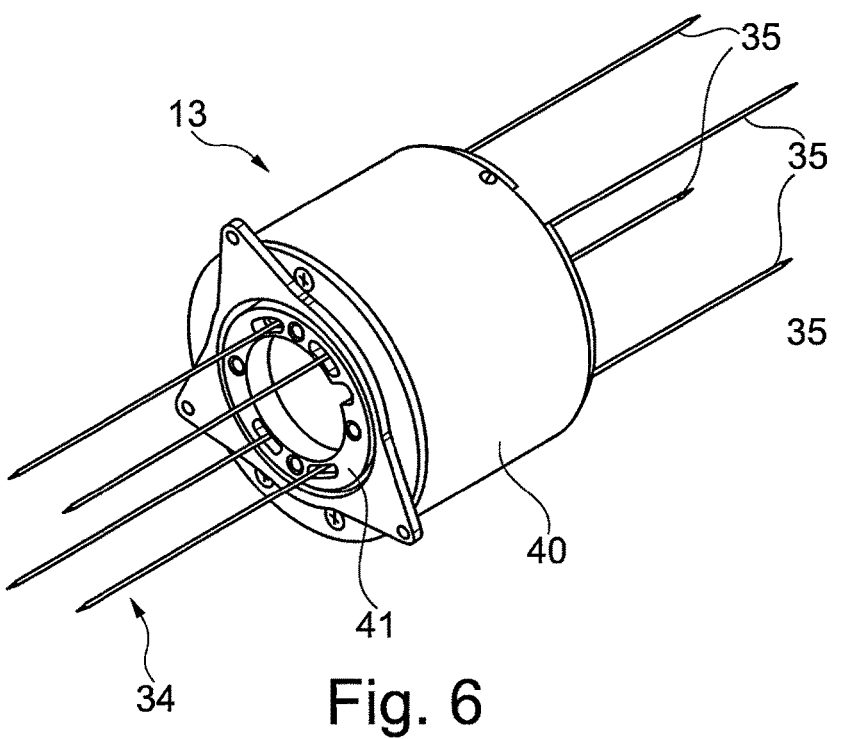
FIG. 6 shows a sliding contact apparatus.

FIG. 6 is a schematic representation of a sliding contact apparatus 13 that comprises a stator 40 and a rotor 41. In this case, the stator 40 is only connected by way of example to two line pairs 35, which are connected to the measuring devices 10a and 10b (see FIG. 5). The corresponding input lines 34 for the switching matrix 9 (see FIG. 5) are assigned to the rotor 41. A plurality of slip rings—not visible in this illustration—are provided inside the sliding contact apparatus 13 and can be contacted or are in contact with sliding brushes that are also not visible. In this way, electrical and/or signal lines can be connected separately between the stator 40 and rotor 41.

Figure 7:
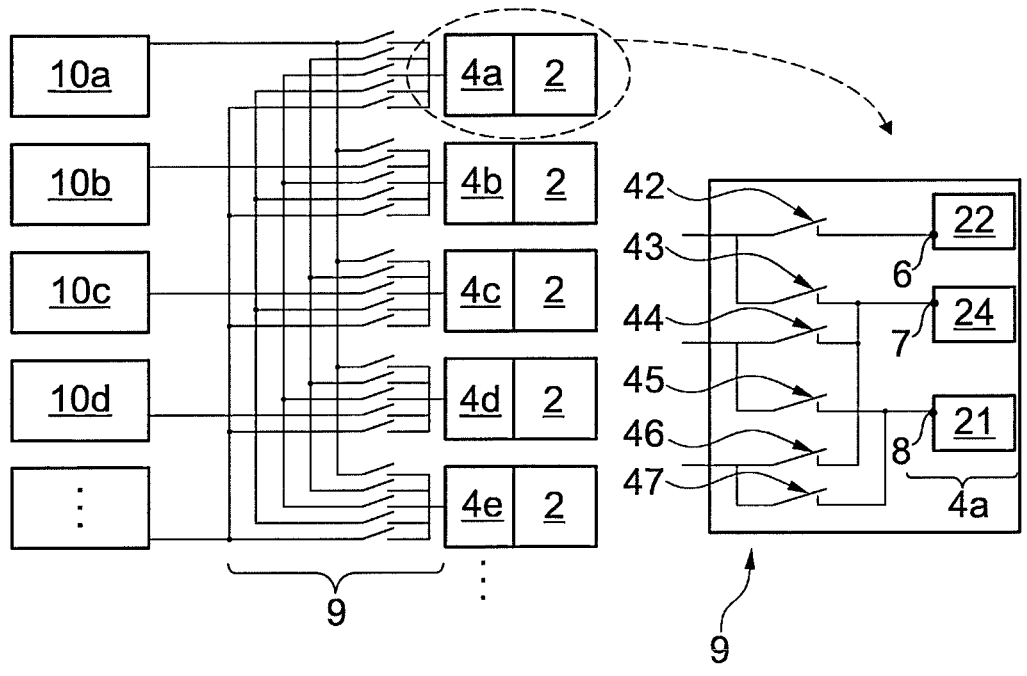
FIG. 7 shows a schematic switching network of a test drum.

FIG. 7 schematically shows a switching network of the testing device 1. Four measuring devices 10a, 10b, 10c, 10d are shown here, wherein the network can in principle be expanded by further measuring devices. It can also be seen that each measuring device 10, 10b, 10c, 10d can in principle be connected to each receiving portion 4a to 4e by means of the switching matrix 9. For the sake of clarity, only five of the twelve receiving portions 4a, . . . , 4l are shown. It can also be seen that the receiving portions 4a, . . . , 4e are each filled with a segment 2. Furthermore, a detailed view of the contact surfaces 6, 7, 8 of the first receiving portion 4a and their connectivity by means of the switches 42, . . . , 47 is shown on the right.

The switches 42, . . . , 47 are a component of the switching matrix 9 and can, for example, be formed by relays 29a, 29b, 29c (see FIG. 5). Depending on the switching position of the switches 42, . . . , 47, the contact surfaces 6, 7, 8 can be connected to each other and/or to one of the measuring devices 10a, 10b, 10c, 10d and/or otherwise. In principle, it is also possible to connect one or more of the receiving portions 4a, . . . , 4l in parallel to different measuring devices 10a, 10b, 10c, 10d in order to parallelize the measuring process. The receiving portions 4a, . . . , 4l can also be connected to a plurality of measuring devices 10a, 10b, 10c, 10d in succession.

Possible switching positions are explained below with reference to FIGS. 9 to 13.

Figure 8:
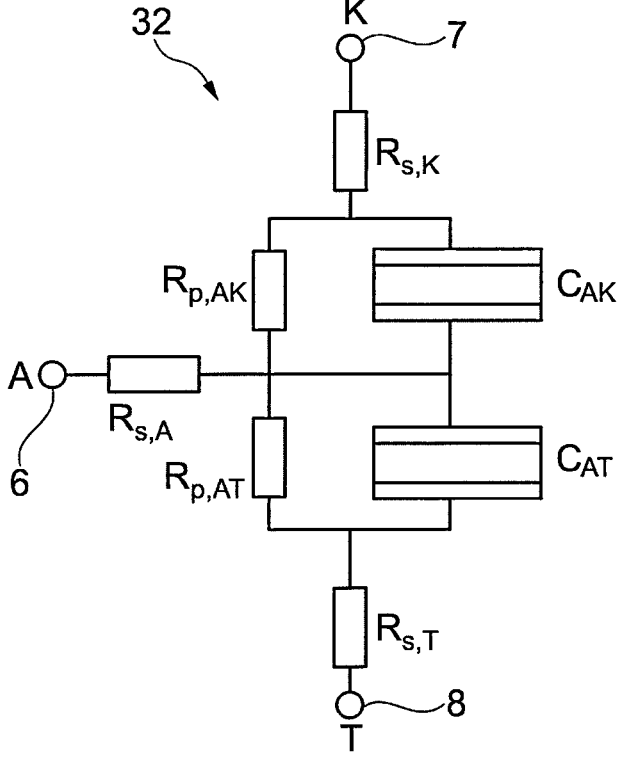
FIG. 8 shows an equivalent circuit diagram of a monocell.

FIG. 8 shows an equivalent circuit diagram 32 of the segment 2 mounted in the receiving portion 4b; cf. FIG. 2. To improve clarity, the first electrode 22 in the form of the anode is identified by an A, the second electrode 24 in the form of the cathode 24 by a K, and the third contact surface 8 forming a transport support by a T. This identification is also retained in the circuit diagrams in FIGS. 9 to 13.

The equivalent circuit diagram 32 of FIG. 8 comprises series resistances $R_{S,A}$, $R_{S,K}$ and $R_{S,T}$, which describe the line and contact resistances at anode A, cathode K and the transport support T formed by the third contact surface 8. Furthermore, a resistance $R_{p,AK}$ is provided, which represents the insulation resistance between the anode A and cathode K, and a resistance $R_{p,AT}$, which represents the insulation resistance between the anode A and the transport support T. The resistances $R_{p,AK}$ and $R_{p,AT}$ therefore characterize the electrical conductivity of the separators 21 and 23. Furthermore, the capacitors represent $C_{AK}$, $C_{AT}$, which are set between the anode A and the cathode K and between the anode A and the transport support T.

The equivalent circuit diagram 32 of FIG. 8 is used as the basis for the switching configurations shown in FIGS. 9 to 13. The measuring device 10a, which is configured to measure an ohmic resistance, is used as an example; however, any other measuring devices can also be used in principle.

When it is mentioned below that a contact surface 6, 7, 8 is connected to ground, this is done in this exemplary embodiment by connecting the corresponding contact surfaces 6, 7 or 8 to the ground conductor or the ground point of the circuit. In principle, however, other options for connecting to ground are also conceivable, for example by connecting to the drum of the conveying apparatus 3 if this is grounded. If it is stated below that a contact surface 6, 7, 8 is not connected, then the corresponding contact surface 6, 7 or 8 is electrically insulated from the electrical lines of the rest of the switching network.

Figures 9, 10, 11:
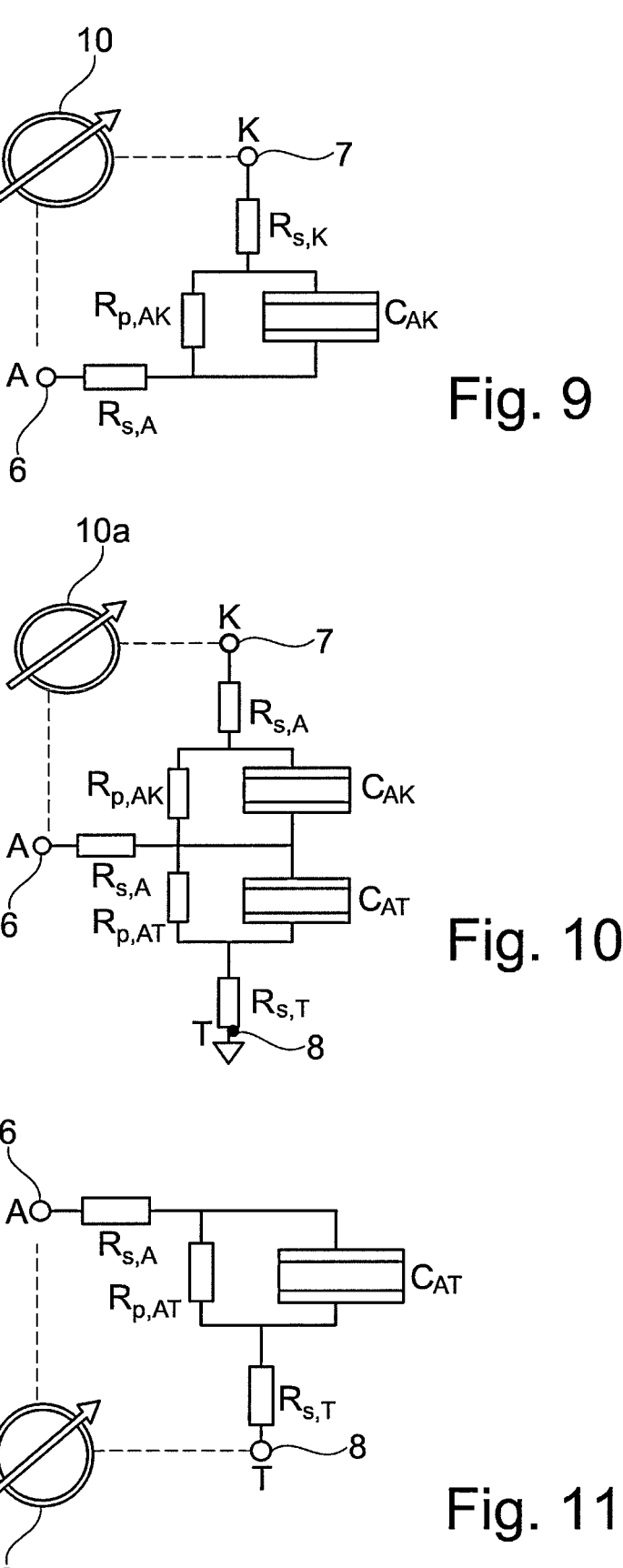
FIG. 9 shows an equivalent circuit diagram of a monocell in a first switching configuration.
FIG. 10 shows an equivalent circuit diagram of a mono-cell in a second switching configuration.
FIG. 11 shows an equivalent circuit diagram of a mono-cell in a third switching configuration.

FIG. 9 shows a first switching configuration that is used to test the second separator 23 (cf. FIG. 3). The measuring device 10*a* is connected to the first and second contact surfaces 6, 7, and therefore to the anode A and the cathode K. The contact surface 8, i.e. the transport support T, is not connected and is therefore not shown.

FIG. 10 shows a second switching configuration that is also used to test the second separator 23 (cf. FIG. 3). The measuring device 10*a* is connected to the first and second contact surfaces 6, 7, and therefore to the anode A and the cathode K. The contact surface 8, i.e. the transport support T, is connected to ground.

FIG. 11 shows a third switching configuration that is used to test the first separator 21 (cf. FIG. 3). The measuring device 10*a* is connected to the first contact surface 6, and via this, also to the anode A as well as to the third contact surface 8, i.e. to the transport support T. The second contact surface 7, on which the cathode K rests, is not connected and is therefore not shown.

Figure 12:
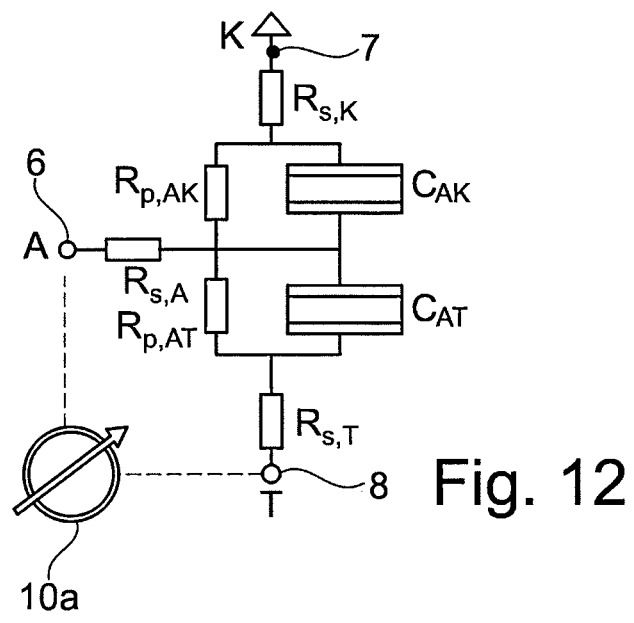
FIG. 12 shows an equivalent circuit diagram of a mono-cell in a fourth switching configuration.

FIG. 12 shows a fourth switching configuration that is also used to test the first separator 21 (cf. FIG. 3). The measuring device 10*a* is connected to the first contact surface 6, and via this, also to the anode A as well as to the third contact surface 8, i.e. the transport support T. The second contact surface 7, on which the cathode K rests, is connected to ground.

Figure 13:
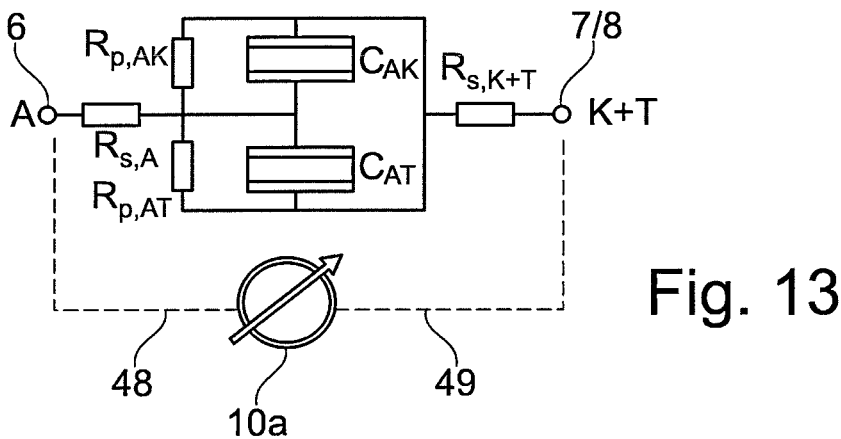
FIG. 13 shows an equivalent circuit diagram of a mono-cell in a fifth switching configuration.

FIG. 13 shows a fifth switching configuration with which the separators 21 and 23 can be tested together. The measuring device 10*a* is connected to the first contact surface 6 and via this to the anode A by means of a first measuring connection 48. Furthermore, the measuring device 10*a* is connected to the second contact surface 7 and the third contact surface 8 by means of a second measuring connection 49. In this fifth switching configuration, the two separators 21 and 23 are connected in parallel with the measuring device 10*a*.

Figure 14:
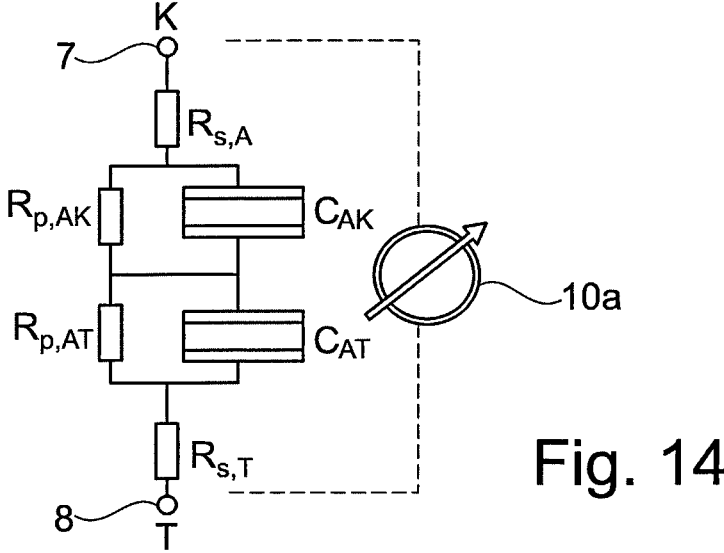
FIG. 14 shows an equivalent circuit diagram of a mono-cell in a sixth switching configuration.

FIG. 14 shows a sixth switching configuration with which the separators 21 and 23 can also be tested together. The measuring device 10*a* is connected to the second contact surface 7 and via this also to the cathode K as well as to the third contact surface 8, i.e. the transport support T. The first contact surface 6, on which the anode A rests, is not connected and is therefore not shown. In this sixth switching configuration, the two separators 21 and 23 are connected in series with the measuring device 10*a*.

The switching configurations shown in FIGS. 9 to 14 can be used to form suitable measuring bridges by means of which the state of the segment located in the receiving portion 4 (cf. FIGS. 2, 3, 4 and 5) can be reliably determined.

The invention claimed is:

1. A testing device for testing segments that are suitable for forming a cell stack for an energy cell producing industry, wherein said testing device comprises:
a conveying apparatus with a plurality of receiving portions for receiving and transporting a segment in each case, wherein the receiving portions are movable relative to a stationary part of the testing device by a movement of the conveying apparatus, wherein
the receiving portions each comprise at least two contact surfaces for contacting, electrically and/or by signal, a segment received in the respective receiving portion, and wherein
at least two of the contact surfaces of one of the receiving portions can be connected to at least one measuring device by means of a switching matrix.

2. The testing device according to claim 1, wherein the receiving portions each comprise at least three contact surfaces.

3. The testing device according to claim 1, wherein the conveying apparatus is formed by a rotatably mounted drum, on a radially outer lateral surface of which the receiving portions are arranged.

4. The testing device according to claim 1, comprising:
a plurality of measuring devices are provided, wherein
the switching matrix is configured to connect, electrically and/or by signal, one or more of the contact surfaces of one of the receiving portions to different measuring devices.

5. The testing device according to claim 1, wherein
the receiving portions each comprise a first and a second contact surface for contacting, electrically and/or by signal, two electrodes of an inserted segment, and wherein
a third contact surface is provided in each case for contacting, electrically and/or by signal, a separator of the inserted segment.

6. The testing device according to claim 5, wherein the switching matrix is configured:
to connect the first and second contact surfaces simultaneously to the same measuring device;
to connect the first and third contact surfaces simultaneously to the same measuring device; and/or
to connect the second and third contact surfaces simultaneously to the same measuring device.

7. The testing device according to claim 1, wherein the contact surfaces are arranged electrically insulated from one another within one of the receiving portions.

8. The testing device according to claim 2, wherein the switching matrix is configured to connect the at least three contact surfaces of one of the receiving portions differently so that measurements can be carried out in different electrical circuits by means of the at least one measuring device.

9. The testing device according to claim 1, wherein the switching matrix is configured to connect one or more of the contact surfaces of one of the receiving portions to a voltage source and/or to ground.

10. The testing device according to claim 1, wherein the switching matrix is a component of the conveying apparatus.

11. The testing device according to claim 1, wherein the at least one measuring device is configured to measure an electrical capacitance and/or an ohmic resistance and/or to carry out a breakdown measurement.

12. The testing device according to claim 1, wherein the at least one measuring device is a component of the stationary part of the testing device.

13. The testing device according to claim 1, wherein the electrical and/or signal connection of the conveying apparatus to the stationary part is made by means of a sliding contact apparatus.

14. The testing device according to claim 1, wherein the receiving portions each have openings to which a vacuum can be applied to hold the segments.

15. A method for testing segments that are provided to form a cell stack for the energy cell producing industry, wherein the segments are tested by the testing device according to claim 1, wherein the segments to be tested are each positioned in one of the receiving portions.

* * * * *